US012475848B2

(12) United States Patent
Shin et al.

(10) Patent No.: US 12,475,848 B2
(45) Date of Patent: Nov. 18, 2025

(54) DISPLAY DEVICE

(71) Applicant: Samsung Display Co., LTD., Yongin-si (KR)

(72) Inventors: Kyoungju Shin, Yongin-si (KR); Suyul Seo, Yongin-si (KR); Jeong-Soo Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/763,160

(22) Filed: Jul. 3, 2024

(65) Prior Publication Data

US 2025/0046249 A1 Feb. 6, 2025

(30) Foreign Application Priority Data

Aug. 3, 2023 (KR) ........................ 10-2023-0101552

(51) Int. Cl.
*G09G 3/3233* (2016.01)
*H10D 86/40* (2025.01)
*H10D 86/60* (2025.01)

(52) U.S. Cl.
CPC ......... *G09G 3/3233* (2013.01); *H10D 86/441* (2025.01); *H10D 86/60* (2025.01); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01)

(58) Field of Classification Search
CPC ............... G09G 3/3233; G09G 3/3266; G09G 2300/0819; G09G 2300/0426; G09G 2300/0861; G09G 2310/08; G09G 2320/0233; H10D 86/441; H10D 86/60
See application file for complete search history.

(56) References Cited

U.S. PATENT DOCUMENTS 10,977,997 B2 4/2021 Kim et al.
2020/0388214 A1* 12/2020 Yang .................... G09G 3/3266
(Continued)

FOREIGN PATENT DOCUMENTS

CN 113808532 B 9/2022
KR 102466372 B1 11/2022
(Continued)

*Primary Examiner* — Xuemei Zheng
(74) *Attorney, Agent, or Firm* — CANTOR COLBURN LLP

(57) ABSTRACT

A display device includes a plurality of pixels where each pixel includes a first transistor connected between a first node and a second node, and including a gate electrode connected to a third node, a second transistor connected between a data line and the first node, and including a gate electrode, a third transistor connected between the second node and the third node, and including a gate electrode, a fourth transistor connected between a first initialization voltage line and the third node, and including a gate electrode, a fifth transistor connected between a first power line and the first node, and including a gate electrode, a sixth transistor connected between the second node and a fourth node, and including a gate electrode, a storage capacitor connected between the third node and the first power line, and a light emitting element connected between the fourth node and a second power line.

18 Claims, 14 Drawing Sheets

(56) References Cited

U.S. PATENT DOCUMENTS

| | | | | |
|---|---|---|---|---|
| 2021/0193046 | A1* | 6/2021 | Wang | G09G 3/3258 |
| 2021/0241689 | A1* | 8/2021 | Lee | H10D 86/423 |
| 2023/0133704 | A1* | 5/2023 | Gai | G09G 3/20<br>345/691 |
| 2023/0186832 | A1 | 6/2023 | Shin et al. | |

FOREIGN PATENT DOCUMENTS

| | | | | |
|---|---|---|---|---|
| KR | 20230109211 | A | 7/2023 | |
| WO | WO-2023024151 | A1 * | 3/2023 | G09G 3/2022 |

* cited by examiner

SD1:ICP,DCP,VAINTL,GCP,
PCP,CCP,ACP,CP1

SD2:DL,PL1,CP2

DISPLAY DEVICE

This application claims priority to Korean Patent Application No. 10-2023-0101552, filed on Aug. 3, 2023, and all the benefits accruing therefrom under 35 USC § 119, the content of which in its entirety is herein incorporated by reference.

BACKGROUND

1. Field

The invention relates to a display device, and more particularly, to an organic light emitting display device.

2. Description of the Related Art

A display device may include a plurality of pixels. Each of the pixels may include a pixel circuit including a driving transistor, and a light emitting element. A driving current may be generated based on a voltage between a gate electrode and a source electrode of the driving transistor, and the light emitting element may emit a light based on the driving current.

When the data voltage is changed by a coupling effect of a parasitic capacitor formed between a data line configured to transmit a data voltage to the pixels and the source electrode of the driving transistor, a voltage of the source electrode of the driving transistor may be changed. When the voltage of the source electrode of the driving transistor is changed (i.e., when the voltage of the source electrode of the driving transistor is not stabilized), a blotch defect such as a Mura phenomenon may occur in the display device.

SUMMARY

Embodiments provide a display device with improved image quality.

A display device, according to embodiments, may include a plurality of pixels. Each of the plurality of pixels may include a first transistor connected between a first node and a second node, and including a gate electrode connected to a third node, a second transistor connected between a data line configured to transmit a data voltage and the first node, and including a gate electrode configured to receive a write gate signal, a third transistor connected between the second node and the third node, and including a gate electrode configured to receive a compensation gate signal, a fourth transistor connected between a first initialization voltage line configured to transmit a first initialization voltage and the third node, and including a gate electrode configured to receive an initialization gate signal, a fifth transistor connected between a first power line configured to transmit a first power voltage and the first node, and including a gate electrode configured to receive the compensation gate signal, a sixth transistor connected between the second node and a fourth node, and including a gate electrode configured to receive an emission control signal, a storage capacitor connected between the third node and the first power line, and a light emitting element connected between the fourth node and a second power line configured to transmit a second power voltage.

In an embodiment, a frame period in which each of the pixels is driven may include an initialization period in which the fourth transistor is turned on in response to the initialization gate signal, a compensation period in which the third transistor is turned on in response to the compensation gate signal, and an emission period in which the sixth transistor is turned on in response to the emission control signal. The first power voltage may be applied to the first node during a period with the exception of the compensation period in the frame period.

In an embodiment, the frame period may further include a write period in which the second transistor is turned on in response to the write gate signal. The write period may be located within the compensation period.

In an embodiment, the third transistor may include an N-type transistor, and the fifth transistor may include a P-type transistor.

In an embodiment, each of the pixels may further include a parasitic capacitor disposed between the data line and the first node.

In an embodiment, each of the pixels may further include a seventh transistor connected between a second initialization voltage line configured to transmit a second initialization voltage and the fourth node, and configured to receive a bypass gate signal.

A display device, according to embodiments, may include a plurality of pixel circuits. Each of the plurality of pixel circuits may include a first active layer disposed on a substrate, and including a first channel region, a second channel region, a fifth channel region, and a sixth channel region. Each of the plurality of pixel circuits may further include a first conductive layer disposed on the first active layer, and including a first gate pattern overlapping the first channel region, a write gate line overlapping the second channel region, a second gate pattern overlapping the fifth channel region, and an emission control line overlapping the sixth channel region. Each of the plurality of pixel circuits may further include a second conductive layer disposed on the first conductive layer, and including a capacitor pattern overlapping the first gate pattern, a first compensation gate line configured to transmit a compensation gate signal, and a first initialization gate line configured to transmit an initialization gate signal. Each of the plurality of pixel circuits may further include a second active layer disposed on the second conductive layer, and including a third channel region overlapping the first compensation gate line and a fourth channel region overlapping the first initialization gate line. Each of the plurality of pixel circuits may further include a third conductive layer disposed on the second active layer, and including a second compensation gate line overlapping the third channel region and a second initialization gate line overlapping the fourth channel region, and a fourth conductive layer disposed on the third conductive layer, and including a gate connection pattern making contact with the first gate pattern and the third drain region of the second active layer located between the third channel region and the fourth channel region and a compensation connection pattern making contact with the second gate pattern and the first compensation gate line.

In an embodiment, the gate connection pattern may not overlap the second compensation gate line.

In an embodiment, the capacitor pattern may be disposed between the first compensation gate line and the first initialization gate line when viewed in a plan view.

In an embodiment, the fourth conductive layer may further include a data connection pattern making contact with a second source region of the first active layer located on one side of the second channel region, a power connection pattern making contact with a fifth source region of the first active layer located on one side of the fifth channel region and the capacitor pattern, an active connection pattern making contact with a first drain region of the first active layer located on one side of the first channel region and a third source region of the second active layer located on one side of the third channel region, and a first connection pattern making contact with a sixth drain region of the first active layer located on one side of the sixth channel region.

In an embodiment, each of the pixel circuits may further include a fifth conductive layer disposed on the fourth conductive layer, and including a data line making contact with the data connection pattern, a first power line making contact with the power connection pattern, and a second connection pattern making contact with the first connection pattern.

In an embodiment, the second conductive layer may further include a first initialization voltage line configured to transmit a first initialization voltage. The fourth conductive layer may further include an initialization connection pattern making contact with the first initialization voltage line and a fourth source region of the second active layer located on one side of the fourth channel region.

In an embodiment, the first active layer may further include a seventh channel region overlapping the write gate line. The fourth conductive layer may further include a second initialization voltage line configured to transmit a second initialization voltage and making contact with a seventh source region of the first active layer located on one side of the seventh channel region.

In an embodiment, the first active layer may include polycrystalline silicon, and the second active layer may include an oxide semiconductor.

A display device, according to embodiments, may include a plurality of pixels. Each of the plurality of pixels may include a first transistor connected between a first node and a second node, and including a gate electrode connected to a third node, a second transistor connected between a data line configured to transmit a data voltage and the second node, and including a gate electrode configured to receive a write gate signal, a third transistor connected between the first node and the third node, and including a gate electrode configured to receive a compensation gate signal, a fourth transistor connected between a first initialization voltage line configured to transmit a first initialization voltage and the third node, and including a gate electrode configured to receive an initialization gate signal, a fifth transistor connected between a first power line configured to transmit a first power voltage and the first node, and including a gate electrode configured to receive the compensation gate signal, a sixth transistor connected between the second node and a fourth node, and including a gate electrode configured to receive an emission control signal, a storage capacitor connected between the third node and the first power line, and a light emitting element connected between the fourth node and a second power line configured to transmit a second power voltage.

In an embodiment, a frame period in which each of the plurality of pixels is driven may include an initialization period in which the fourth transistor is turned on in response to the initialization gate signal, a compensation period in which the third transistor is turned on in response to the compensation gate signal, and an emission period in which the sixth transistor is turned on in response to the emission control signal. The first power voltage may be applied to the first node during a period with the exception of the compensation period in the frame period.

In an embodiment, the frame period may further include a write period in which the second transistor is turned on in response to the write gate signal. The write period may be located within the compensation period.

In an embodiment, the third transistor may include an N-type transistor, and the fifth transistor may include a P-type transistor.

In an embodiment, each of the plurality of pixels may further include a parasitic capacitor formed between the data line and the second node.

In an embodiment, each of the plurality of pixels may further include a seventh transistor connected between a second initialization voltage line configured to transmit a second initialization voltage and the fourth node, and configured to receive a bypass gate signal.

In the display device, according to the embodiments, the first power voltage may be applied to the first electrode of the first transistor (e.g., driving transistor) through the fifth transistor based on the compensation gate signal during the frame period with the exception of the compensation period in which the threshold voltage of the first transistor is compensated for, so that a voltage of the first electrode of the first transistor may be stabilized. Accordingly, a blotch defect may not occur in the display device, and the image quality of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
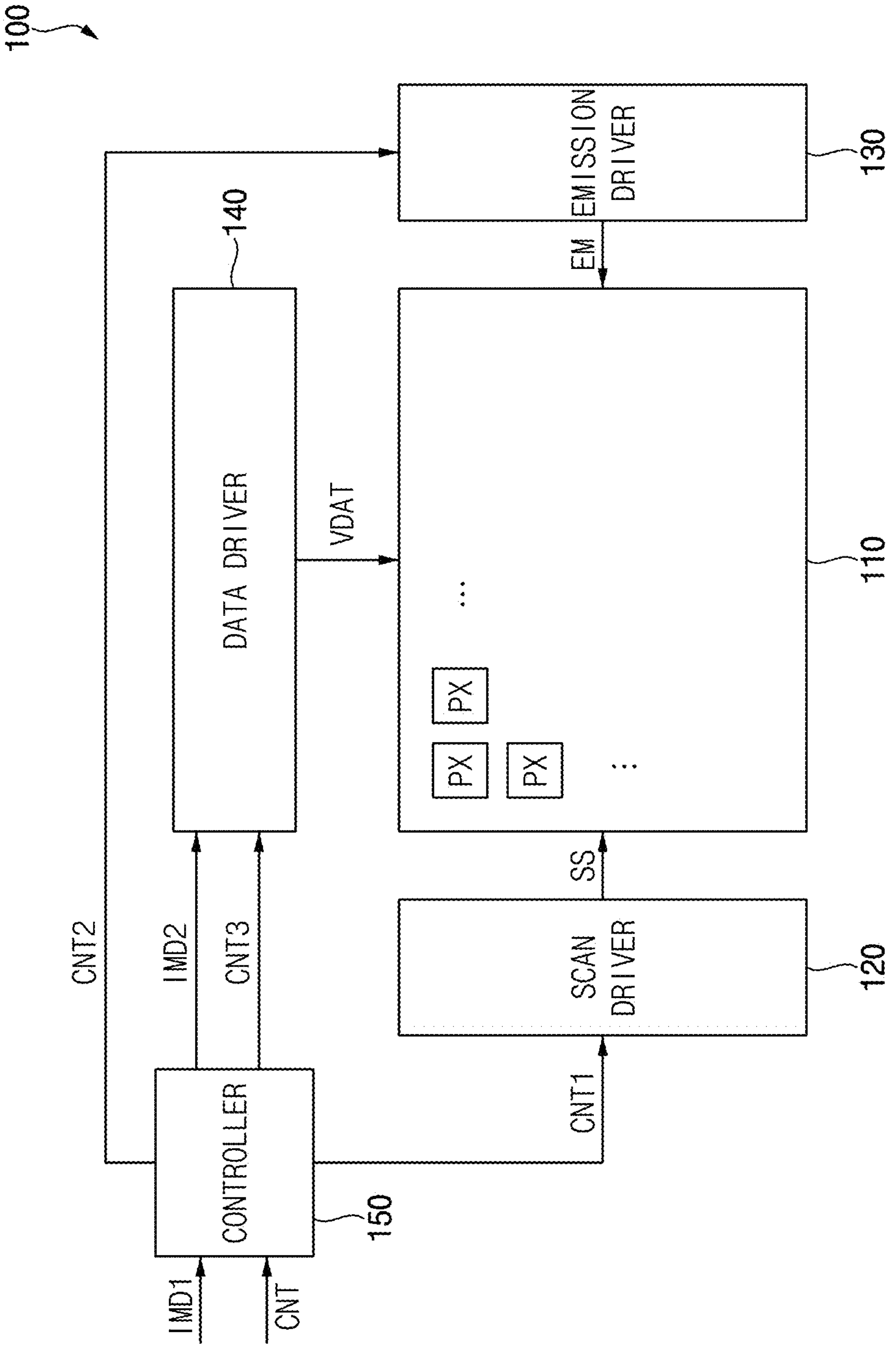
FIG. 1 is a block diagram showing a display device, according to an embodiment.

Hereinafter, a display device according to embodiments will be described in more detail with reference to the accompanying drawings. The same or similar reference numerals will be used for the same elements in the accompanying drawings. The invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, or the like) is referred to as being related to another such as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

The term "and/or," includes all combinations of one or more of which associated configurations may define.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "comprise", "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof. As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram showing a display device 100, according to an embodiment.

In an embodiment and referring to FIG. 1, a display device 100 may include a display panel 110, a scan driver 120, an emission driver 130, a data driver 140, and a controller 150.

In an embodiment, the display panel 110 may include pixels PX. According to an embodiment, the pixels PX may include a first pixel configured to emit a light having a first color, a second pixel configured to emit a light having a second color, and a third pixel configured to emit a light having a third color. For example, the first color, the second color, and the third color may be red, green, and blue, respectively.

In an embodiment, the scan driver 120 may provide scan signals SS to the pixels PX. The scan driver 120 may sequentially generate first to $n^{th}$ scan signals SS (where n is a natural number that is greater than or equal to 2) corresponding to first to $n^{th}$ pixel rows, respectively, based on a first control signal CNT1. The first control signal CNT1 may include a scan clock signal, a scan start signal, and the like.

In an embodiment, the emission driver 130 may provide emission control signals EM to the pixels PX. The emission driver 130 may sequentially generate first to $n^{th}$ emission control signals EM corresponding to the first to $n^{th}$ pixel rows, respectively, based on a second control signal CNT2. The second control signal CNT2 may include an emission clock signal, an emission start signal, and the like.

In an embodiment, the data driver 140 may provide data voltages VDAT to the pixels PX. The data driver 140 may generate first to $m^{th}$ data voltages VDAT (where m is a natural number that is greater than or equal to 2) corresponding to first to $m^{th}$ pixel columns, respectively, based on second image data IMD2 and a third control signal CNT3. According to an embodiment, the second image data IMD2 may include gray level values corresponding to the pixels PX. The third control signal CNT3 may include a data clock signal, a horizontal start signal, a load signal, and the like.

In an embodiment, the controller 150 may control an operation (or driving) of the scan driver 120, an operation (or driving) of the emission driver 130, and an operation (or driving) of the data driver 140. The controller 150 may generate the first control signal CNT1, the second control signal CNT2, the second image data IMD2, and the third control signal CNT3 based on first image data IMD1 and a control signal CNT. According to an embodiment, the first image data IMD1 may include gray level values corresponding to the pixels PX. The controller 150 may convert the first image data IMD1 into the second image data IMD2. The control signal CNT may include a master clock signal, a vertical synchronization signal, a horizontal synchronization signal, a data enable signal, and the like.

Figure 2:
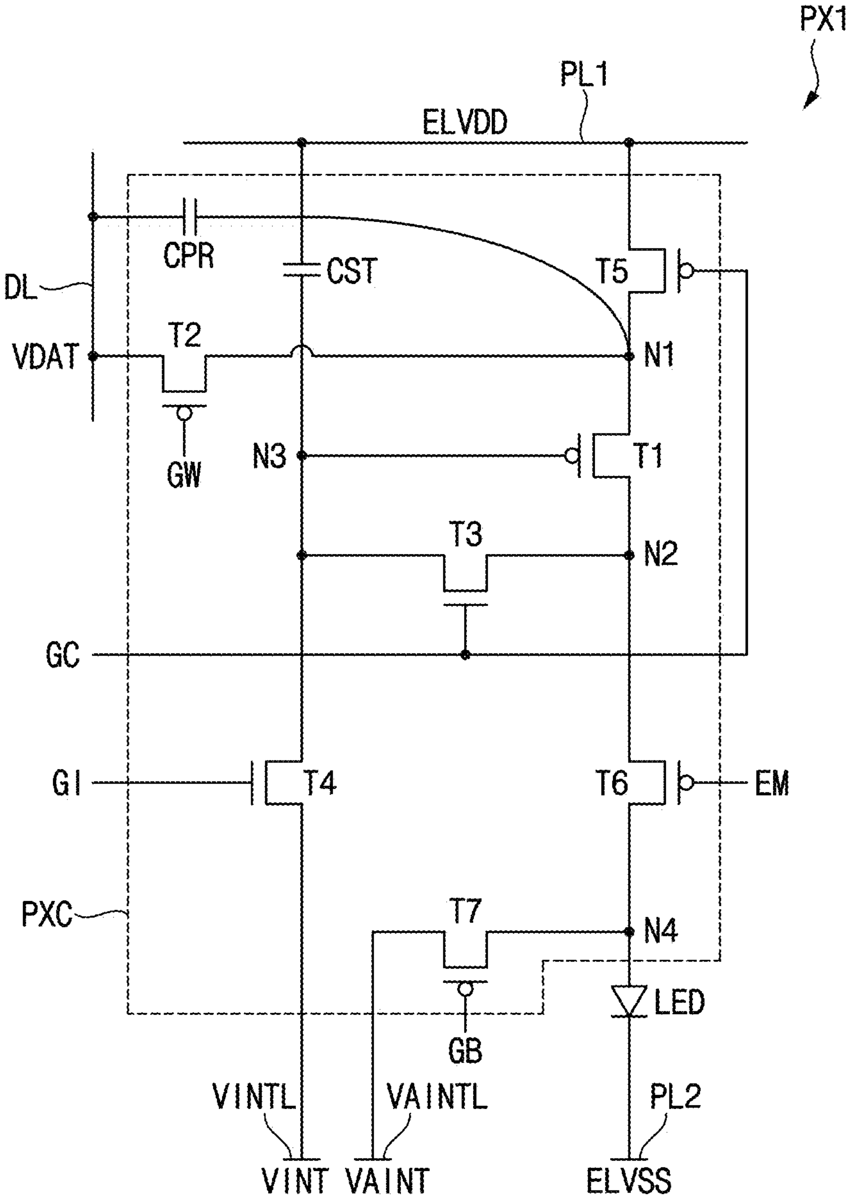
FIG. 2 is a circuit diagram showing an example of a pixel included in the display device of FIG. 1, according to an embodiment.

FIG. 2 is a circuit diagram showing an example of a pixel PX1 included in the display device 100 of FIG. 1, according to an embodiment.

In an embodiment and referring to FIGS. 1 and 2, a pixel PX1 may include a pixel circuit PXC and a light emitting element LED. The pixel circuit PXC may include a first transistor T1, a second transistor T2, a third transistor T3, a fourth transistor T4, a fifth transistor T5, a sixth transistor T6, a seventh transistor T7, and a storage capacitor CST. According to an embodiment, the pixel circuit PXC may further include a parasitic capacitor CPR. The scan signal SS may include a write gate signal GW, a compensation gate signal GC, an initialization gate signal GI, and a bypass gate signal GB.

In an embodiment, the first transistor T1 may be connected between a first node N1 and a second node N2. The first transistor T1 may include a first electrode connected to the first node N1, a second electrode connected to the second node N2, and a gate electrode connected to a third node N3. The first transistor T1 may generate a driving current corresponding to a voltage between the first node N1 and the third node N3. The first transistor T1 may be referred to as a driving transistor.

In an embodiment, the second transistor T2 may be connected between a data line DL configured to transmit the data voltage VDAT and the first node N1, and may be turned on in response to the write gate signal GW having a low voltage level. The second transistor T2 may include a first electrode connected to the data line DL, a second electrode connected to the first node N1, and a gate electrode configured to receive the write gate signal GW. The second transistor T2 may transmit the data voltage VDAT to the first node N1 in response to the write gate signal GW having the low voltage level. The second transistor T2 may be referred to as a write transistor.

In an embodiment, the third transistor T3 may be connected between the second node N2 and the third node N3, and turned on in response to the compensation gate signal GC having a high voltage level. The third transistor T3 may include a first electrode connected to the second node N2, a second electrode connected to the third node N3, and a gate electrode configured to receive the compensation gate signal GC. The third transistor T3 may connect the second node N2 to the third node N3 in response to the compensation gate signal GC having the high voltage level. The third transistor T3 may be referred to as a compensation transistor.

According to an embodiment, the third transistor T3 may include a bottom gate electrode and a top gate electrode, which are configured to receive the compensation gate signal GC. In other words, the third transistor T3 may be a dual gate transistor.

In an embodiment, the fourth transistor T4 may be connected between a first initialization voltage line VINTL configured to transmit a first initialization voltage VINT and the third node N3, and turned on in response to the initialization gate signal GI having a high voltage level. The fourth transistor T4 may include a first electrode connected to the first initialization voltage line VINTL, a second electrode connected to the third node N3, and a gate electrode configured to receive the initialization gate signal GI. The fourth transistor T4 may transmit the first initialization voltage VINT to the third node N3 in response to the initialization gate signal GI having the high voltage level. The fourth transistor T4 may be referred to as an initialization transistor.

According to an embodiment, the fourth transistor T4 may include a bottom gate electrode and a top gate electrode, which are configured to receive the initialization gate signal GI. In other words, the fourth transistor T4 may be a dual gate transistor.

In an embodiment, the fifth transistor T5 may be connected between a first power line PL1 configured to transmit a first power voltage ELVDD and the first node N1, and turned on in response to the compensation gate signal GC having a low voltage level. The fifth transistor T5 may include a first electrode connected to the first power line PL1, a second electrode connected to the first node N1, and a gate electrode configured to receive the compensation gate signal GC. The fifth transistor T5 may transmit the first power voltage ELVDD to the first node N1 in response to the compensation gate signal GC having the low voltage level.

In an embodiment, the sixth transistor T6 may be connected between the second node N2 and a fourth node N4, and turned on in response to the emission control signal EM having a low voltage level. The sixth transistor T6 may include a first electrode connected to the second node N2, a second electrode connected to the fourth node N4, and a gate electrode configured to receive the emission control signal EM. The sixth transistor T6 may connect the second node N2 to the fourth node N4 in response to the emission control signal EM having the low voltage level. The sixth transistor T6 may be referred to as an emission control transistor.

In an embodiment, the seventh transistor T7 may be connected between a second initialization voltage line VAINTL configured to transmit a second initialization voltage VAINT and the fourth node N4, and turned on in response to the bypass gate signal GB having a low voltage level. The seventh transistor T7 may include a first electrode connected to the second initialization voltage line VAINTL, a second electrode connected to the fourth node N4, and a gate electrode configured to receive the bypass gate signal GB. The seventh transistor T7 may transmit the second initialization voltage VAINT to the fourth node N4 in response to the bypass gate signal GB having the low voltage level.

According to an embodiment, each of the first transistor T1, the second transistor T2, the fifth transistor T5, the sixth transistor T6, and the seventh transistor T7 may be a P-type transistor (e.g., a PMOS transistor), and each of the third transistor T3 and fourth transistor T4 may be an N-type transistor (e.g., an NMOS transistor). According to an embodiment, each of the first transistor T1, the second transistor T2, the fifth transistor T5, the sixth transistor T6, and the seventh transistor T7 may be a polycrystalline silicon transistor, and each of the third transistor T3 and fourth transistor T4 may be an oxide semiconductor transistor.

In an embodiment, the storage capacitor CST may be connected between the third node N3 and the first power line PL1. The storage capacitor CST may include a first electrode connected to the third node N3, and a second electrode connected to the first power line PL1. The storage capacitor CST may store a voltage of the third node N3.

In an embodiment, the parasitic capacitor CPR may be formed between the data line DL and the first node N1. The parasitic capacitor CPR may be an unintended capacitor generated by overlapping of the data line DL and the first node N1. When the data voltage VDAT transmitted by the data line DL is changed by a coupling effect of the parasitic capacitor CPR, a voltage of the first node N1 may be changed.

In an embodiment, the light emitting element LED may be connected between the fourth node N4 and a second power line PL2 configured to transmit a second power voltage ELVSS. The light emitting element LED may include a first electrode (e.g., an anode) connected to the fourth node N4, and a second electrode (e.g., a cathode) connected to the second power line PL2. The light emitting element LED may emit a light based on the driving current generated by the first transistor T1.

According to an embodiment, the light emitting element LED may be an organic light emitting diode. According to another embodiment, the light emitting element LED may be an inorganic light emitting diode, a micro-light emitting diode, or a quantum dot light emitting diode.

Figure 3:
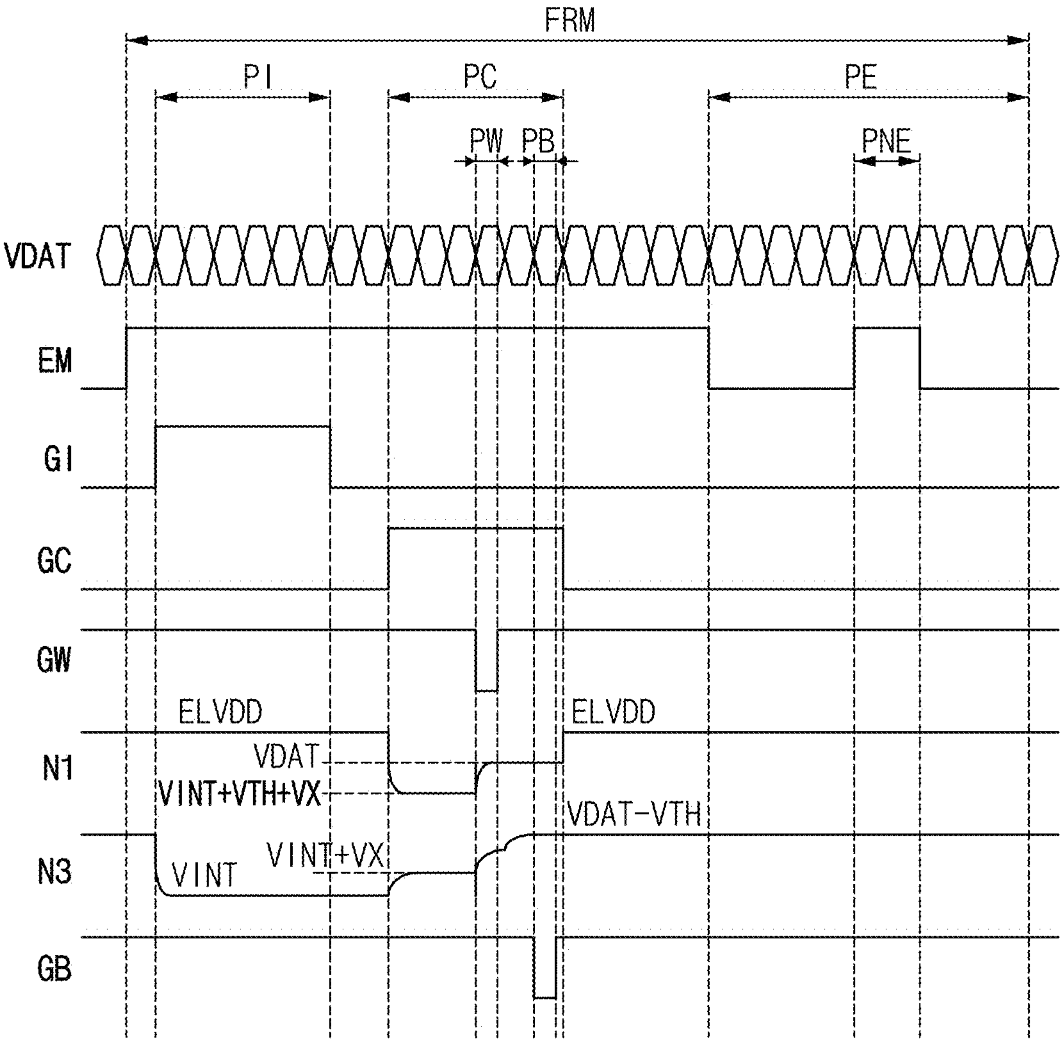
FIG. 3 is a waveform diagram for describing an operation of the pixel of FIG. 2, according to an embodiment.
Figure 4:
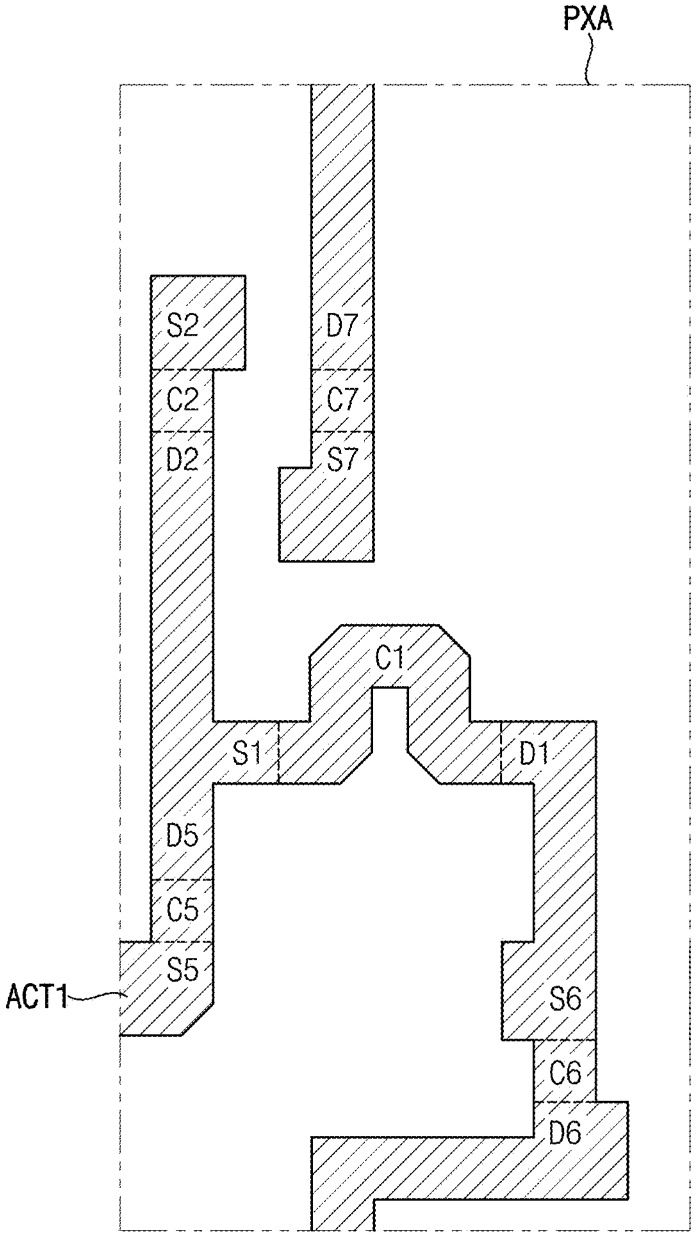
FIG. 4 is a layout diagram showing a pixel circuit region in which a pixel circuit included in the pixel of FIG. 2 is disposed, according to an embodiment.
Figure 5:
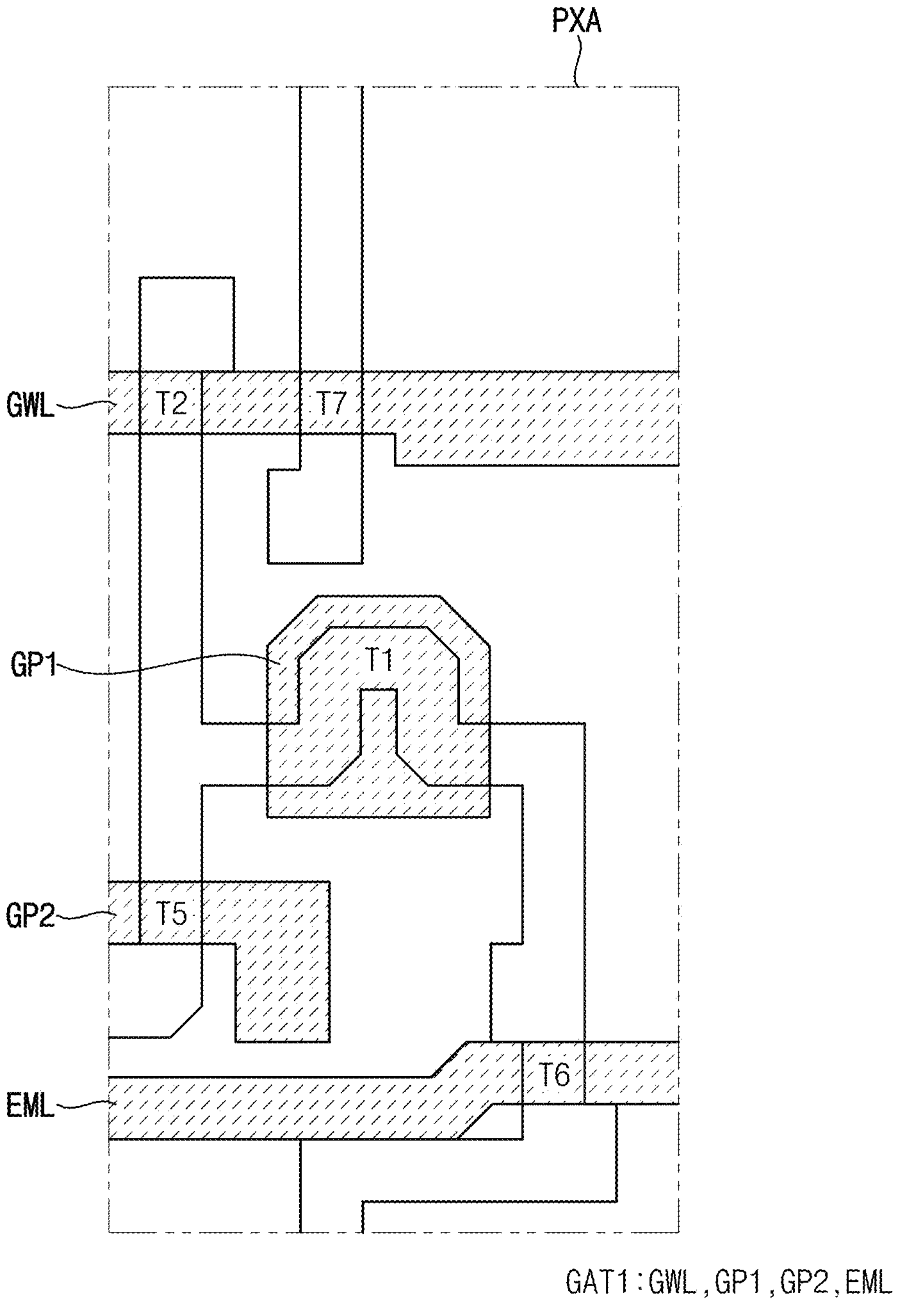
FIG. 5 is a layout diagram showing a pixel circuit region in which a pixel circuit included in the pixel of FIG. 2 is disposed, according to an embodiment.
Figure 6:
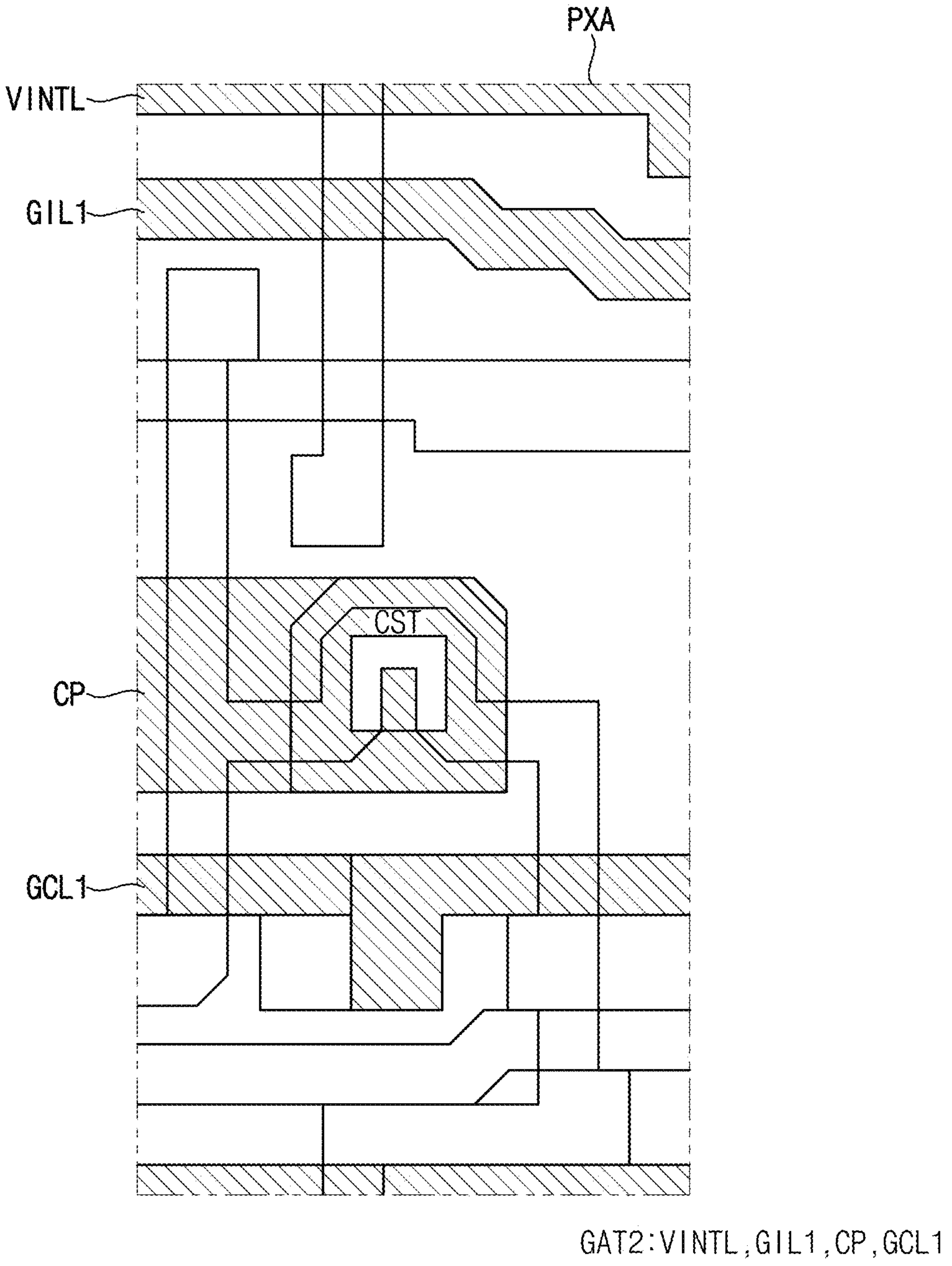
FIG. 6 is a layout diagram showing a pixel circuit region in which a pixel circuit included in the pixel of FIG. 2 is disposed, according to an embodiment.
Figure 7:
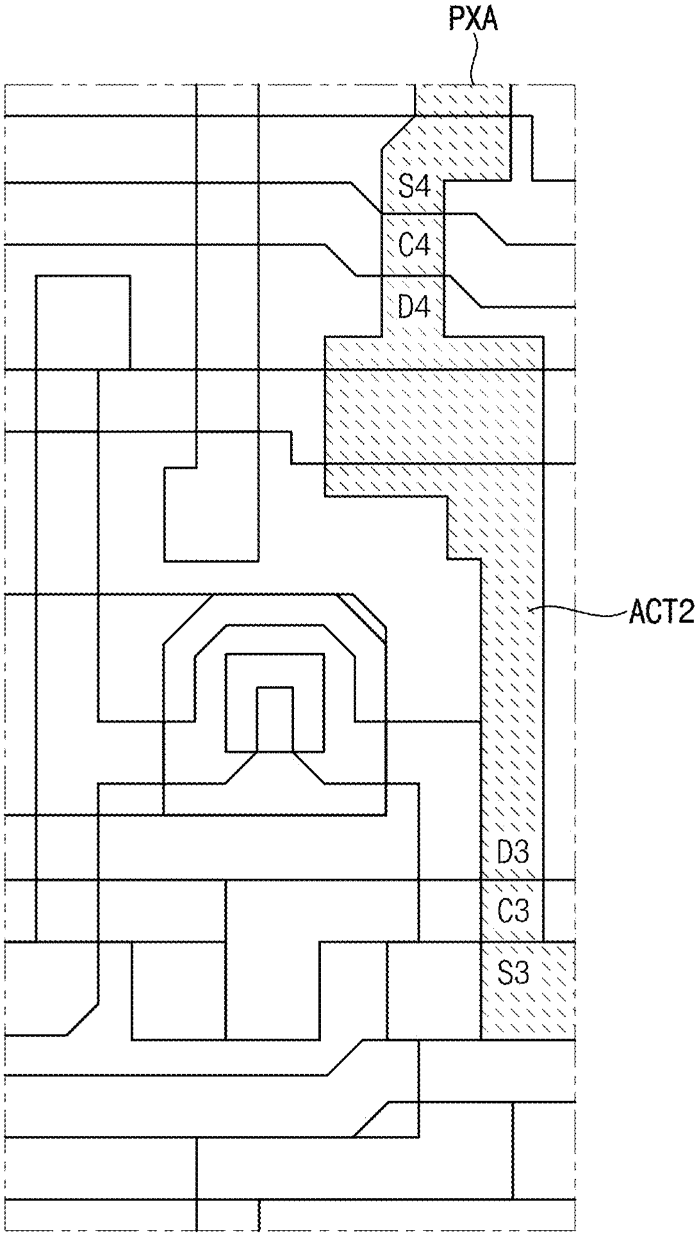
FIG. 7 is a layout diagram showing a pixel circuit region in which a pixel circuit included in the pixel of FIG. 2 is disposed, according to an embodiment.
Figure 8:
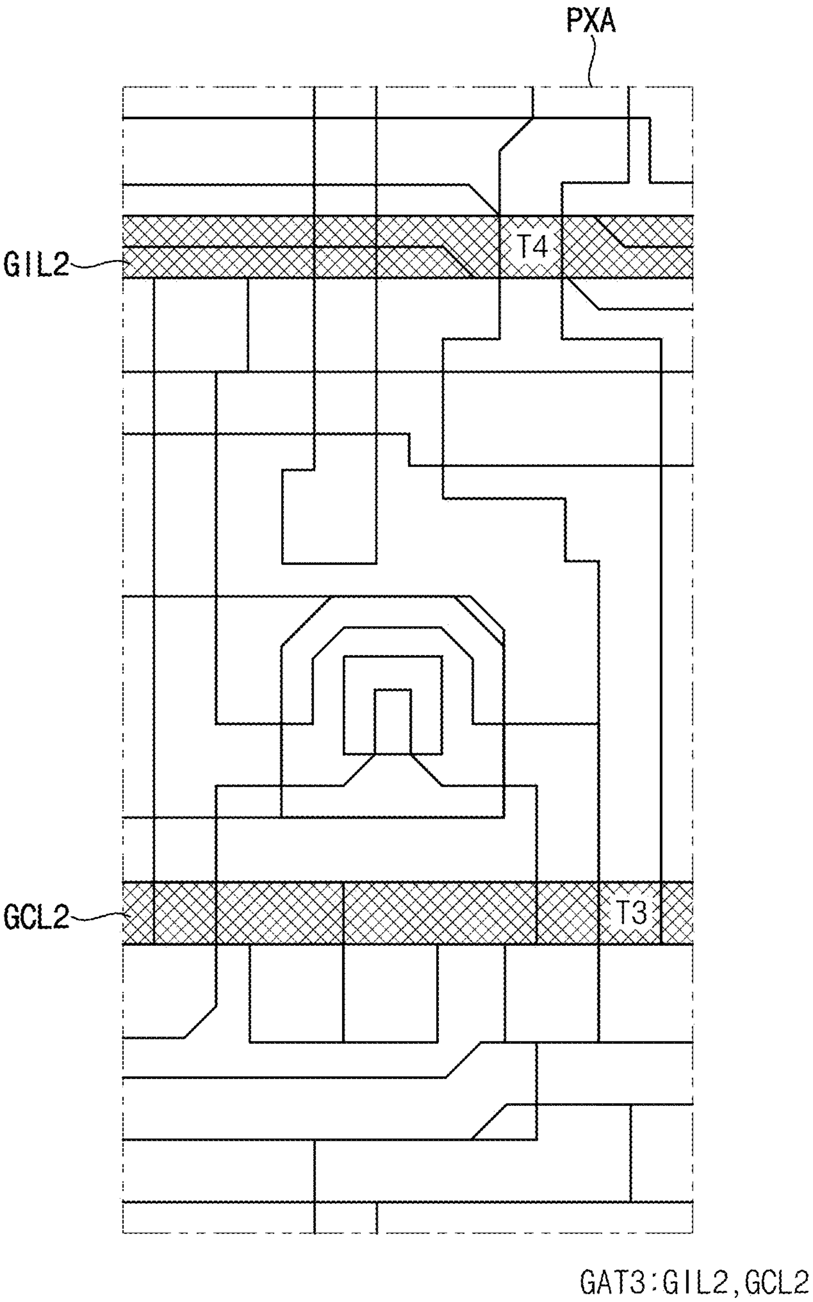
FIG. 8 is a layout diagram showing a pixel circuit region in which a pixel circuit included in the pixel of FIG. 2 is disposed, according to an embodiment.
Figure 9:
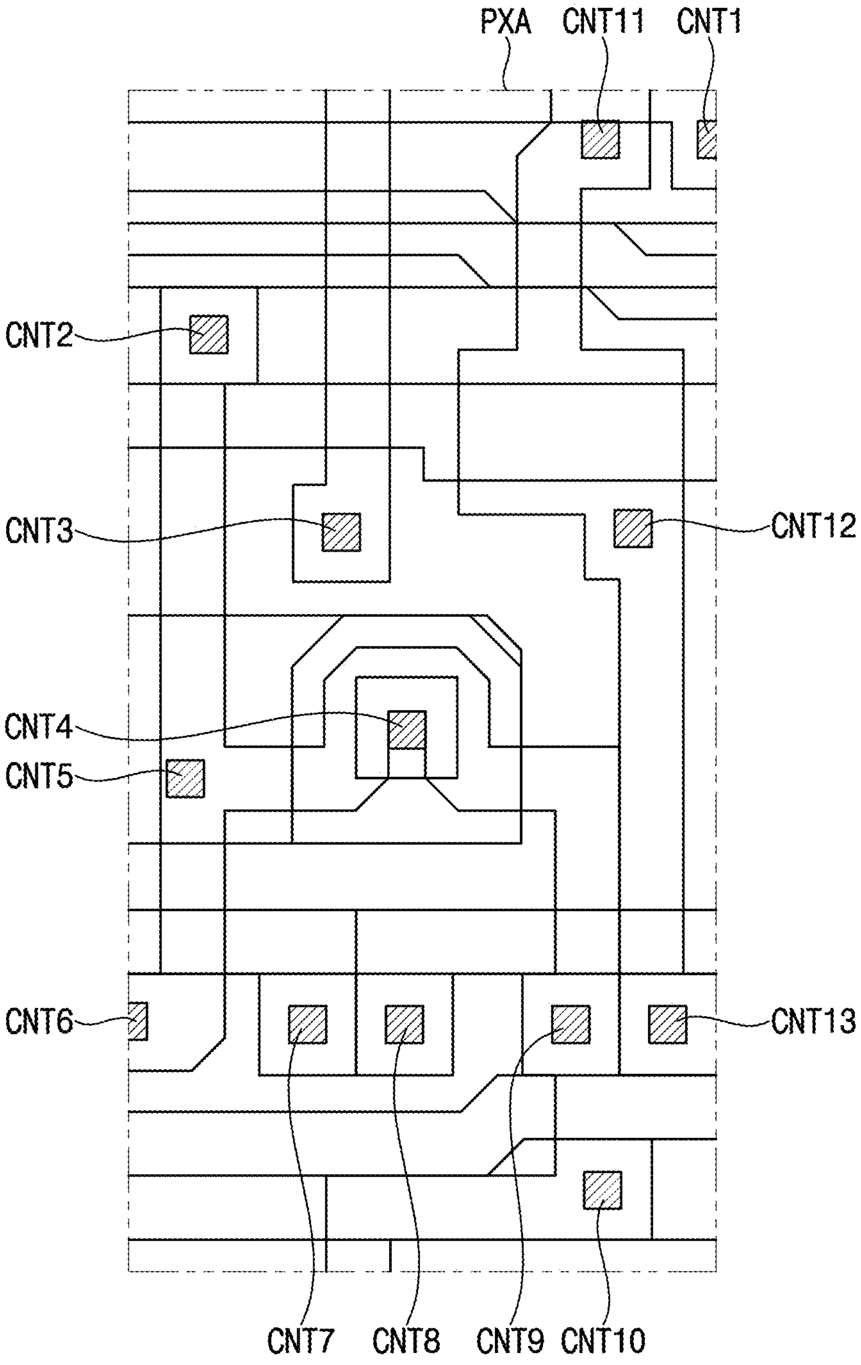
FIG. 9 is a layout diagram showing a pixel circuit region in which a pixel circuit included in the pixel of FIG. 2 is disposed, according to an embodiment.
Figure 10:
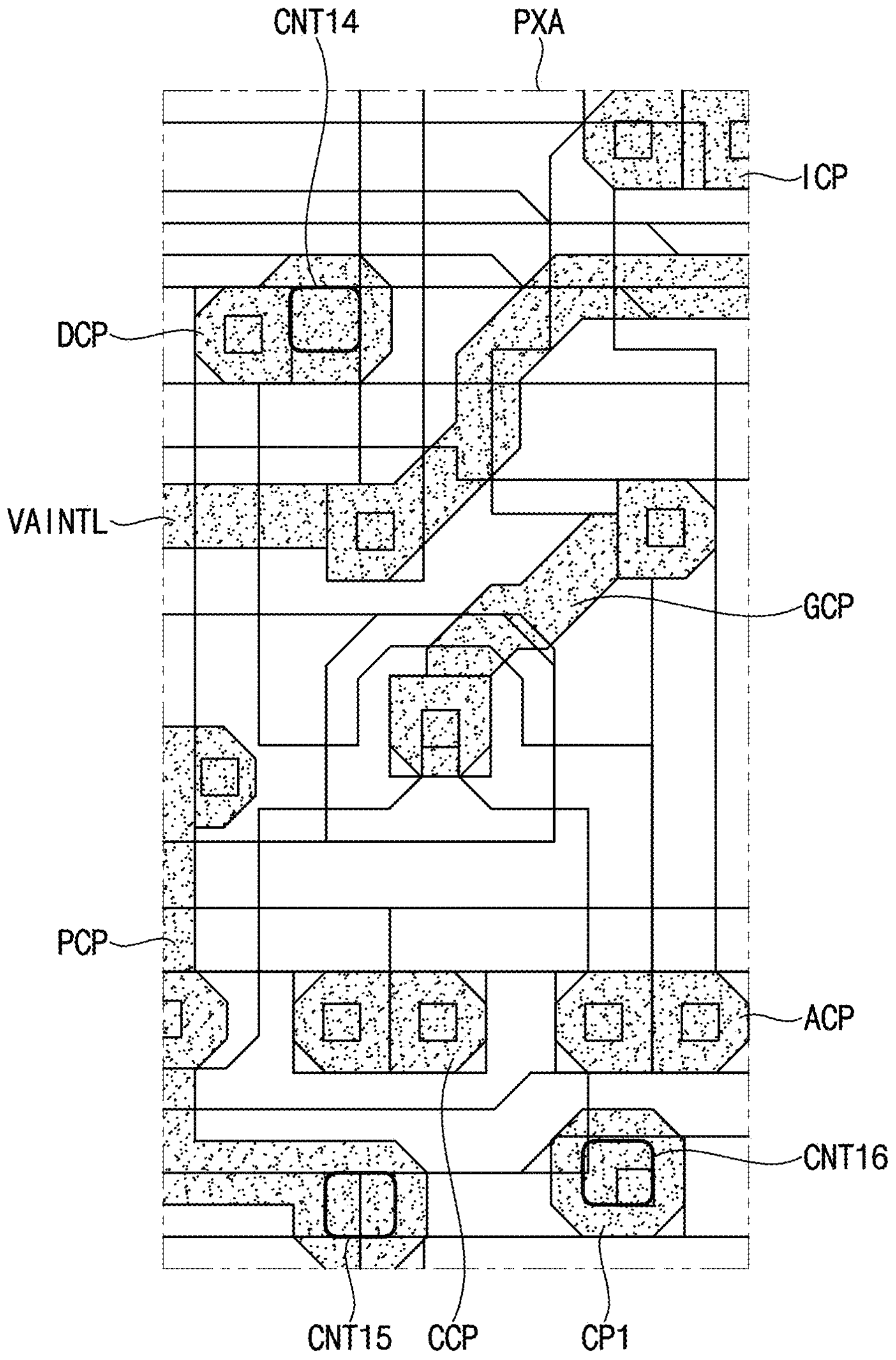
FIG. 10 is a layout diagram showing a pixel circuit region in which a pixel circuit included in the pixel of FIG. 2 is disposed, according to an embodiment.
Figure 11:
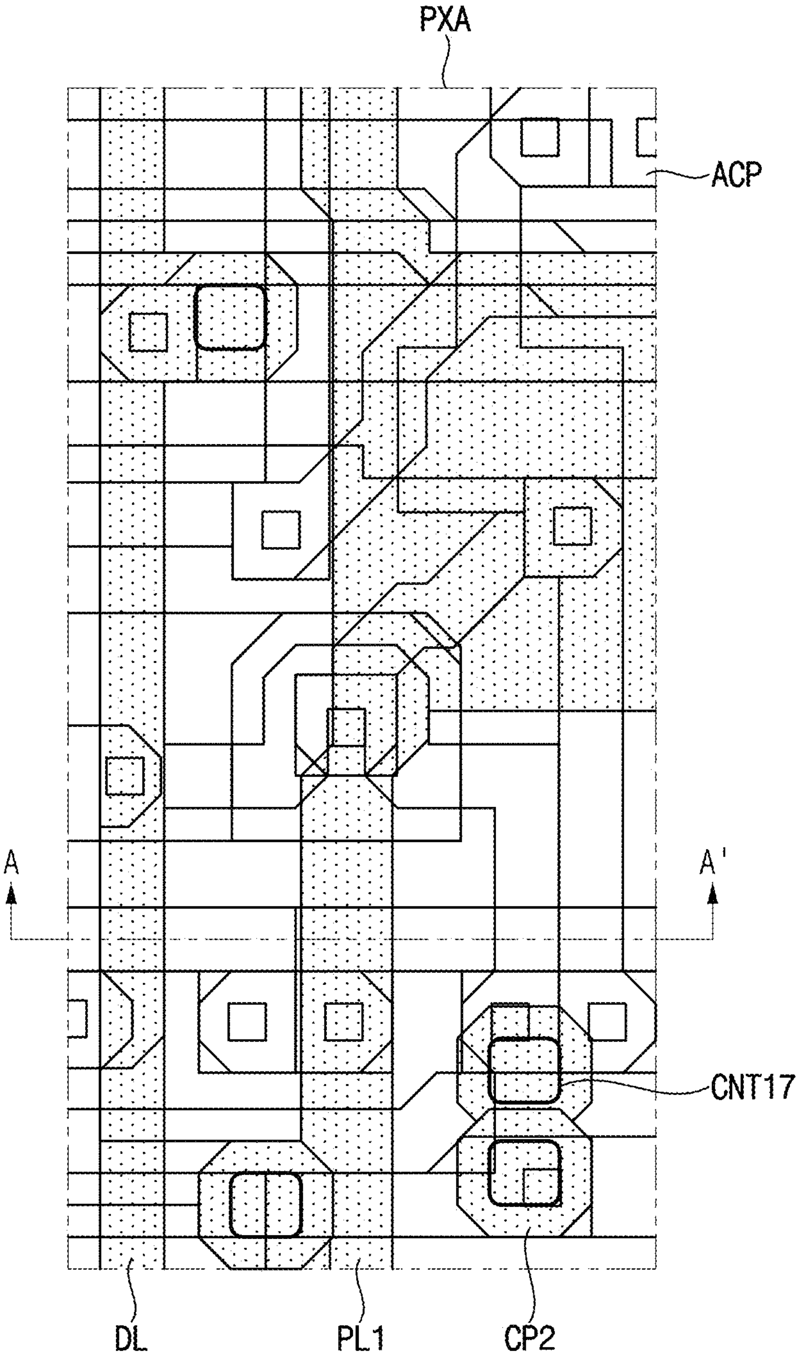
FIG. 11 is a layout diagram showing a pixel circuit region in which a pixel circuit included in the pixel of FIG. 2 is disposed, according to an embodiment.

FIG. 3 is a waveform diagram for describing an operation of the pixel PX1 of FIG. 2, according to an embodiment.

In an embodiment and referring to FIGS. 2 and 3, the data voltage VDAT, the emission control signal EM, the initialization gate signal GI, the compensation gate signal GC, the write gate signal GW, and the bypass gate signal GB may be provided to the pixel PX1. According to an embodiment, the compensation gate signal GC may be a signal obtained by shifting the initialization gate signal GI by a predetermined time. According to an embodiment, the bypass gate signal GB may be a signal obtained by shifting the write gate signal GW by a predetermined time.

In an embodiment, a frame period FRM in which the pixel PX1 is driven may include an initialization period PI, a compensation period PC, a write period PW, a bypass period PB, and an emission period PE.

In an embodiment, in the initialization period PI, the fourth transistor T4 may be turned on in response to the initialization gate signal GI having the high voltage level, and the first initialization voltage VINT may be transmitted to the third node N3 through the fourth transistor T4.

In an embodiment, in the compensation period PC after the initialization period PI, the third transistor T3 may be turned on in response to the compensation gate signal GC having the high voltage level, and the second node N2 and the third node N3 may be connected to each other. Accordingly, the first transistor T1 may be diode-connected, a voltage VINT+VTH+VX obtained by adding the first initialization voltage VINT, a threshold voltage VTH of the first transistor T1, and a coupling voltage VX may be applied to the first node N1, and a voltage VINT+VX obtained by adding the first initialization voltage VINT and the coupling voltage VX may be applied to the third node N3. The coupling voltage VX may vary depending on a capacitance of the storage capacitor CST and a capacitance of the parasitic capacitor between the first node N1 and the first power line PL1.

In an embodiment, in the write period PW located within the compensation period PC, the second transistor T2 may be turned on in response to the write gate signal GW having the low voltage level, and the data voltage VDAT may be transmitted to the first node N1 through the second transistor T2. In addition, a voltage VDAT-VTH obtained by subtracting the threshold voltage VTH of the first transistor T1 from the data voltage VDAT may be applied to the third node N3 through the first transistor T1 that is diode-connected by the turned-on third transistor T3.

In an embodiment, in the bypass period PB, the seventh transistor T7 may be turned on in response to the bypass gate signal GB having the low voltage level, and the second initialization voltage VAINT may be transmitted to the fourth node N4 through the seventh transistor T7. In this case, charges charged in the parasitic capacitor of the light emitting element LED may escape to the second initialization voltage line VAINTL through the seventh transistor T7.

In an embodiment, in the emission period PE, the sixth transistor T6 may be turned on in response to the emission control signal EM having the low voltage level, and the second node N2 and the fourth node N4 may be connected to each other. Accordingly, the first transistor T1 and the light emitting element LED may be connected to each other through the sixth transistor T6, the driving current corresponding to a voltage between the first electrode and the gate electrode of the first transistor T1 (the voltage between the first node N1 and the third node N3) may be provided to the light emitting element LED, and the light emitting element LED may emit the light based on the driving current.

In an embodiment, the first power voltage ELVDD may be applied to the first node N1 during a period except for the compensation period PC in the frame period FRM. In the period except for the compensation period PC in the frame period FRM, the fifth transistor T5 may be turned on in response to the compensation gate signal GC having the low voltage level, and the first power voltage ELVDD may be transmitted to the first node N1 through the fifth transistor T5.

In an embodiment, the data line DL may be connected to one pixel column including a plurality of pixels. When the data voltage VDAT transmitted to the pixels is changed, the voltage of the first node N1 may be changed by the coupling effect of the parasitic capacitor CPR formed between the data line DL and the first node N1. The voltage between the first electrode and the gate electrode of the first transistor T1 may be changed when the voltage of the first node N1 is changed, and a blotch defect such as a Mura phenomenon may occur in the display device 100 due to the change in the voltage between the first electrode and the gate electrode of the first transistor T1.

According to an embodiment, the first power voltage ELVDD may be applied to the first node N1 during the period except for the compensation period PC in the frame period FRM, so that the voltage of the first node N1 may be stabilized, and the voltage between the first electrode and the gate electrode of the first transistor T1 may not be changed. Accordingly, the blotch defect such as the Mura phenomenon may not occur in the display device 100.

According to an embodiment, the emission period PE may include a non-emission period PNE. In the non-emission period PNE within the emission period PE, the sixth transistor T6 may be turned off in response to the emission control signal EM having a high voltage level, and the second node N2 and the fourth node N4 may be separated from each other. Accordingly, the driving current may not be provided to the light emitting element LED, and the light emitting element LED may not emit the light. A luminance of the light emitted from the pixel PX1 may be controlled by controlling a ratio of the non-emission period PNE to the emission period PE. Meanwhile, the voltage of the first node N1 may be maintained as the first power voltage ELVDD even in the non-emission period PNE, so that the voltage of the first node N1 may be stabilized.

Figure 12:
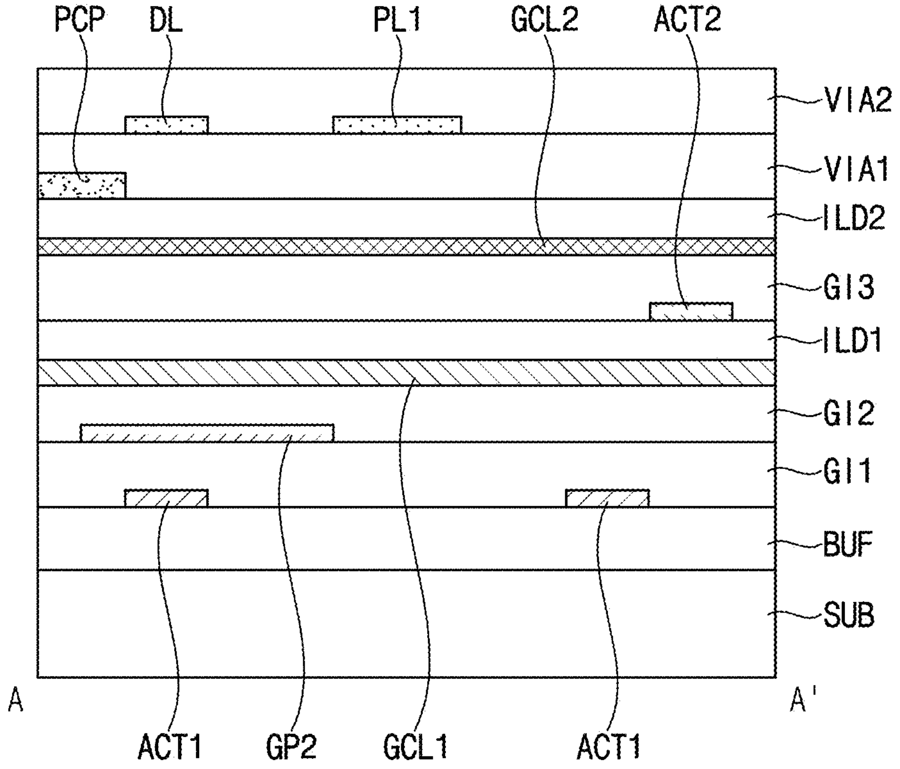
FIG. 12 is a sectional view of the layout diagram of FIG. 11 taken along a line A-A' of FIG. 11, according to an embodiment.

FIGS. 4 to 11 are layout diagrams showing a pixel circuit region PXA in which a pixel circuit PXC included in the pixel PX1 of FIG. 2 is disposed, according to an embodiment. FIG. 12 is a sectional view of the pixel circuit region PXA taken along a line A-A' of FIG. 11, according to an embodiment.

In an embodiment and referring to FIGS. 2 and 4 to 12, the pixel circuit PXC may include a first active layer ACT1, a first gate insulating layer GI1, a first conductive layer GAT1 (hereinafter referred to as a “first gate layer”), a second gate insulating layer GI2, a second conductive layer GAT2 (hereinafter referred to as a “second gate layer”), a first interlayer insulating layer ILD1, a second active layer ACT2, a third gate insulating layer GI3, a third conductive layer GAT3 (hereinafter referred to as a “third gate layer”), a second interlayer insulating layer ILD2, a fourth conductive layer SD1 (hereinafter referred to as a “first source-drain layer”), a first via insulating layer VIA1, a fifth conductive layer SD2 (hereinafter referred to as a “second source-drain layer”), and a second via insulating layer VIA2.

According to an embodiment, a substrate SUB may be a flexible substrate including an organic material. For example, the substrate SUB may include a first organic layer, a first barrier layer disposed on the first organic layer, a second organic layer disposed on the first barrier layer, and a second barrier layer disposed on the second organic layer. According to another embodiment, the substrate SUB may be a rigid substrate including glass.

In an embodiment, a buffer layer BUF may be disposed on the substrate SUB. According to an embodiment, the buffer layer BUF may include an inorganic insulating material. For example, the buffer layer BUF may include silicon oxide, silicon nitride, silicon oxynitride, and the like.

In an embodiment, the first active layer ACT1 may be disposed on the buffer layer BUF. According to an embodiment, the first active layer ACT1 may include polycrystalline silicon. The first active layer ACT1 may include a first channel region C1, a first source region S1 and a first drain region D1 located on both sides of the first channel region C1, a second channel region C2, a second source region S2 and a second drain region D2 located on both sides of the second channel region C2, a fifth channel region C5, a fifth source region S5 and a fifth drain region D5 located on both sides of the fifth channel region C5, a sixth channel region C6, a sixth source region S6 and a sixth drain region D6 located on both sides of the sixth channel region C6, a seventh channel region C7, and a seventh source region S7 and a seventh drain region D7 located on both sides of the seventh channel region C7.

According to an embodiment, the first source region S1 and the first drain region D1 may correspond to the first electrode and the second electrode of the first transistor T1, respectively, the second source region S2 and the second drain region D2 may correspond to the first electrode and the second electrode of the second transistor T2, respectively, the fifth source region S5 and the fifth drain region D5 may correspond to the first electrode and the second electrode of the fifth transistor T5, respectively, the sixth source region S6 and the sixth drain region D6 may correspond to the first electrode and the second electrode of the sixth transistor T6, respectively, and the seventh source region S7 and the seventh drain region D7 may correspond to the first electrode and the second electrode of the seventh transistor T7, respectively.

In an embodiment, the first gate insulating layer GI1 may be disposed on the first active layer ACT1. According to an embodiment, the first gate insulating layer GI1 may include an inorganic insulating material. For example, the first gate insulating layer GI1 may include silicon oxide, silicon nitride, silicon oxynitride, and the like.

In an embodiment, the first gate layer GAT1 may be disposed on the first gate insulating layer GI1. According to an embodiment, the first gate layer GAT1 may include a conductive material. For example, the first gate layer GAT1 may include a metal, a metal compound, and the like. The first gate layer GAT1 may include a write gate line GWL, a first gate pattern GP1, a second gate pattern GP2, and an emission control line EML.

In an embodiment, the write gate line GWL may transmit the write gate signal GW. The write gate line GWL may overlap the second channel region C2 and the seventh channel region C7. A portion of the write gate line GWL overlapping the second channel region C2 may correspond to the gate electrode of the second transistor T2, and a portion of the write gate line GWL overlapping the seventh channel region C7 may correspond to the gate electrode of the seventh transistor T7.

In an embodiment, the first gate pattern GP1 may overlap the first channel region C1. A portion of the first gate pattern GP1 overlapping the first channel region C1 may correspond to the gate electrode of the first transistor T1. In addition, the first gate pattern GP1 may correspond to the first electrode of the storage capacitor CST.

In an embodiment, the second gate pattern GP2 may overlap the fifth channel region C5. A portion of the second gate pattern GP2 overlapping the fifth channel region C5 may correspond to the gate electrode of the fifth transistor T5.

In an embodiment, the emission control line EML may transmit the emission control signal EM. The emission control line EML may overlap the sixth channel region C6. A portion of the emission control line EML overlapping the sixth channel region C6 may correspond to the gate electrode of the sixth transistor T6.

In an embodiment, the second gate insulating layer GI2 may be disposed on the first gate layer GAT1. According to an embodiment, the second gate insulating layer GI2 may include an inorganic insulating material. For example, the second gate insulating layer GI2 may include silicon oxide, silicon nitride, silicon oxynitride, and the like.

In an embodiment, the second gate layer GAT2 may be disposed on the second gate insulating layer GI2. According to an embodiment, the second gate layer GAT2 may include a conductive material. For example, the second gate layer GAT2 may include a metal, a metal compound, and the like. The second gate layer GAT2 may include the first initialization voltage line VINTL, a first initialization gate line GIL1, a capacitor pattern CP, and a first compensation gate line GCL1.

In an embodiment, the first initialization voltage line VINTL may transmit the first initialization voltage VINT.

In an embodiment, the first initialization gate line GIL1 may transmit the initialization gate signal GI. A portion of the first initialization gate line GIL1 overlapping a fourth channel region C4 of the second active layer ACT2 may correspond to the bottom gate electrode of the fourth transistor T4.

In an embodiment, the capacitor pattern CP may overlap the first gate pattern GP1. A portion of the capacitor pattern CP overlapping the first gate pattern GP1 may correspond to the second electrode of the storage capacitor CST.

In an embodiment, the first compensation gate line GCL1 may transmit the compensation gate signal GC. A portion of the first compensation gate line GCL1 overlapping a third channel region C3 of the second active layer ACT2 may correspond to the bottom gate electrode of the third transistor T3.

In an embodiment, the capacitor pattern CP may be disposed between the first compensation gate line GCL1 and the first initialization gate line GIL1 when viewed in a plan view. In other words, the first compensation gate line GCL1 may be spaced apart from the first initialization gate line GIL1 with the capacitor pattern CP interposed therebetween when viewed in a plan view.

In an embodiment, the first interlayer insulating layer ILD1 may be disposed on the second gate layer GAT2. According to an embodiment, the first interlayer insulating layer ILD1 may include an inorganic insulating material. For example, the first interlayer insulating layer ILD1 may include silicon oxide, silicon nitride, silicon oxynitride, and the like.

In an embodiment, the second active layer ACT2 may be disposed on the first interlayer insulating layer ILD1. According to an embodiment, the second active layer ACT2 may include an oxide semiconductor. The second active layer ACT2 may include a third channel region C3, wherein a third source region S3 and a third drain region D3 are located on both sides of the third channel region C3, and a fourth channel region C4, wherein a fourth source region S4 and a fourth drain region D4 are located on both sides of the fourth channel region C4.

According to an embodiment, the third source region S3 and the third drain region D3 may correspond to the first electrode and the second electrode of the third transistor T3, respectively, and the fourth source region S4 and the fourth drain region D4 may correspond to the first electrode and the second electrode of the fourth transistor T4, respectively.

In an embodiment, the third gate insulating layer GI3 may be disposed on the second active layer ACT2. According to an embodiment, the third gate insulating layer GI3 may include an inorganic insulating material. For example, the third gate insulating layer GI3 may include silicon oxide, silicon nitride, silicon oxynitride, and the like.

In an embodiment, the third gate layer GAT3 may be disposed on the third gate insulating layer GI3. According to an embodiment, the third gate layer GAT3 may include a conductive material. For example, the third gate layer GAT3 may include a metal, a metal compound, and the like. The third gate layer GAT3 may include a second initialization gate line GIL2 and a second compensation gate line GCL2.

In an embodiment, the second initialization gate line GIL2 may transmit the initialization gate signal GI. A portion of the second initialization gate line GIL2 overlapping the fourth channel region C4 of the second active layer ACT2 may correspond to the top gate electrode of the fourth transistor T4.

In an embodiment, the second compensation gate line GCL2 may transmit the compensation gate signal GC. A portion of the second compensation gate line GCL2 overlapping the third channel region C3 of the second active layer ACT2 may correspond to the top gate electrode of the third transistor T3.

In an embodiment, the second interlayer insulating layer ILD2 may be disposed on the third gate layer GAT3. According to an embodiment, the second interlayer insulating layer ILD2 may include an inorganic insulating material. For example, the second interlayer insulating layer ILD2 may include silicon oxide, silicon nitride, silicon oxynitride, and the like.

In an embodiment, the first source-drain layer SD1 may be disposed on the second interlayer insulating layer ILD2. According to an embodiment, the first source-drain layer SD1 may include a conductive material. For example, the first source-drain layer SD1 may include a metal, a metal compound, and the like. The first source-drain layer SD1 may include an initialization connection pattern ICP, a data connection pattern DCP, the second initialization voltage line VAINTL, a gate connection pattern GCP, a power connection pattern PCP, a compensation connection pattern CCP, an active connection pattern ACP, and a first connection pattern CP1.

In an embodiment, the initialization connection pattern ICP may make contact with the first initialization voltage line VINTL and the fourth source region S4. The initialization connection pattern ICP may make contact with the first initialization voltage line VINTL through a first contact hole CNT1 formed through the second interlayer insulating layer ILD2, the third gate insulating layer GI3, and the first interlayer insulating layer ILD1, and make contact with the fourth source region S4 through an $11^{th}$ contact hole CNT11 formed through the second interlayer insulating layer ILD2, the third gate insulating layer GI3, the first interlayer insulating layer ILD1, the second gate insulating layer GI2, and the first gate insulating layer GI1.

In an embodiment, the data connection pattern DCP may make contact with the second source region S2. The data connection pattern DCP may make contact with the second source region S2 through a second contact hole CNT2 formed through the second interlayer insulating layer ILD2, the third gate insulating layer GI3, the first interlayer insulating layer ILD1, the second gate insulating layer GI2, and the first gate insulating layer GI1.

In an embodiment, the second initialization voltage line VAINTL may transmit the second initialization voltage VAINT. The second initialization voltage line VAINTL may make contact with the seventh source region S7. The second initialization voltage line VAINTL may make contact with the seventh source region S7 through a third contact hole CNT3 formed through the second interlayer insulating layer ILD2, the third gate insulating layer GI3, the first interlayer insulating layer ILD1, the second gate insulating layer GI2, and the first gate insulating layer GI1.

In an embodiment, the gate connection pattern GCP may make contact with the first gate pattern GP1 and the third drain region D3 (or the fourth drain region D4). The gate connection pattern GCP may make contact with the first gate pattern GP1 through a fourth contact hole CNT4 formed through the second interlayer insulating layer ILD2, the third gate insulating layer GI3, the first interlayer insulating layer ILD1, and the second gate insulating layer GI2, and make contact with the third drain region D3 through a $12^{th}$ contact hole CNT12 formed through the second interlayer insulating layer ILD2 and the third gate insulating layer GI3.

In an embodiment, the power connection pattern PCP may make contact with the capacitor pattern CP and the fifth source region S5. The power connection pattern PCP may make contact with the capacitor pattern CP through a fifth contact hole CNT5 formed through the second interlayer insulating layer ILD2, the third gate insulating layer GI3, and the first interlayer insulating layer ILD1, and make contact with the fifth source region S5 through a sixth contact hole CNT6 formed through the second interlayer insulating layer ILD2, the third gate insulating layer GI3, the first interlayer insulating layer ILD1, the second gate insulating layer GI2, and the first gate insulating layer GI1

In an embodiment, the compensation connection pattern CCP may make contact with the second gate pattern GP2 and the first compensation gate line GCL1. The compensation connection pattern CCP may make contact with the second gate pattern GP2 through a seventh contact hole CNT7 formed through the second interlayer insulating layer ILD2, the third gate insulating layer GI3, the first interlayer insulating layer ILD1, and the second gate insulating layer GI2, and make contact with the first compensation gate line GCL1 through an eighth contact hole CNT8 formed through the second interlayer insulating layer ILD2, the third gate insulating layer GI3, and the first interlayer insulating layer ILD1.

In an embodiment, the active connection pattern ACP may make contact with the first drain region D1 (or the sixth source region S6) and the third source region S3. The active connection pattern ACP may make contact with the first drain region D1 through a ninth contact hole CNT9 formed through the second interlayer insulating layer ILD2, the third gate insulating layer GI3, the first interlayer insulating layer ILD1, the second gate insulating layer GI2, and the first gate insulating layer GI1, and make contact with the third source region S3 through a 13$^{th}$ contact hole CNT13 formed through the second interlayer insulating layer ILD2 and the third gate insulating layer GI3.

In an embodiment, the first connection pattern CP1 may make contact with the sixth drain region D6 (or the seventh drain region D7). The first connection pattern CP1 may make contact with the sixth drain region D6 through a 10$^{th}$ contact hole CNT10 formed through the second interlayer insulating layer ILD2, the third gate insulating layer GI3, the first interlayer insulating layer ILD1, the second gate insulating layer GI2, and the first gate insulating layer GI1.

According to an embodiment, the gate connection pattern GCP may not overlap the second compensation gate line GCL2. When the gate connection pattern GCP overlaps the second compensation gate line GCL2, a parasitic capacitor may be formed between the gate connection pattern GCP and the second compensation gate line GCL2, and the gate electrode of the first transistor T1 may be influenced by a change in the compensation gate signal GC due to a coupling effect of the parasitic capacitor. However, according to an embodiment, the gate connection pattern GCP may not overlap the second compensation gate line GCL2, so that the parasitic capacitor may not be formed between the gate connection pattern GCP and the second compensation gate line GCL2, and the gate electrode of the first transistor T1 may not be influenced by the change in the compensation gate signal GC.

In an embodiment, the first via insulating layer VIA1 may be disposed on the first source-drain layer SD1. According to an embodiment, the first via insulating layer VIA1 may include an inorganic insulating material. For example, the first via insulating layer VIA1 may include silicon oxide, silicon nitride, silicon oxynitride, and the like. According to another embodiment, the first via insulating layer VIA1 may include an organic insulating material. For example, the first via insulation layer VIA1 may include polyimide (PI) and the like.

In an embodiment, the second source-drain layer SD2 may be disposed on the first via insulating layer VIA1. According to an embodiment, the second source-drain layer SD2 may include a conductive material. For example, the second source-drain layer SD2 may include a metal, a metal compound, and the like. The second source-drain layer SD2 may include the data line DL, the first power line PL1, and a second connection pattern CP2.

In an embodiment, the data line DL may make contact with the data connection pattern DCP. The data line DL may make contact with the data connection pattern DCP through a 14$^{th}$ contact hole CNT14 formed through the first via insulating layer VIA1.

In an embodiment, the first power line PL1 may make contact with the power connection pattern PCP. The first power line PL1 may make contact with the power connection pattern PCP through a 15$^{th}$ contact hole CNT15 formed through the first via insulating layer VIA1.

In an embodiment, the second connection pattern CP2 may make contact with the first connection pattern CP1. The second connection pattern CP2 may make contact with the first connection pattern CP1 through a 16$^{th}$ contact hole CNT16 formed through the first via insulating layer VIA1.

In an embodiment, the second via insulating layer VIA2 may be disposed on the second source-drain layer SD2. According to an embodiment, the second via insulating layer VIA2 may include an inorganic insulating material. For example, the second via insulating layer VIA2 may include silicon oxide, silicon nitride, silicon oxynitride, and the like. According to another embodiment, the second via insulating layer VIA2 may include an organic insulating material. For example, the second via insulation layer VIA2 may include polyimide (PI) and the like.

In an embodiment, the first electrode of the light emitting element LED may make contact with the second connection pattern CP2. The first electrode of the light emitting element LED may make contact with the second connection pattern CP2 through a 17$^{th}$ contact hole CNT17 formed through the second via insulating layer VIA2.

Figure 13:
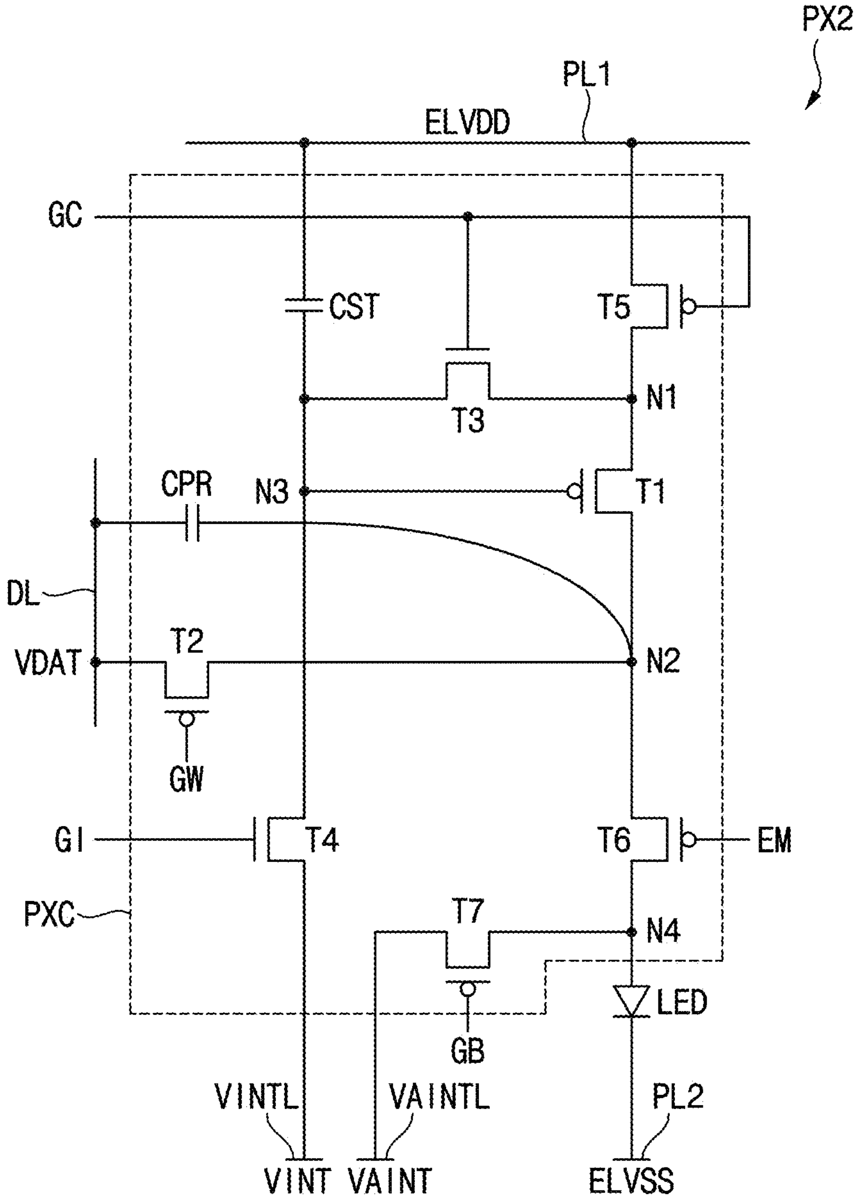
FIG. 13 is a circuit diagram showing another example of a pixel included in the display device of FIG. 1, according to an embodiment.

FIG. 13 is a circuit diagram showing another example of a pixel PX2 included in the display device 100 of FIG. 1, according to an embodiment.

In an embodiment and referring to FIGS. 1 and 13, a pixel PX2 may include a pixel circuit PXC and a light emitting element LED. The pixel circuit PXC may include a first transistor T1, a second transistor T2, a third transistor T3, a fourth transistor T4, a fifth transistor T5, a sixth transistor T6, a seventh transistor T7, and a storage capacitor CST. According to an embodiment, the pixel circuit PXC may further include a parasitic capacitor CPR. While describing the pixel PX2 with reference to FIG. 13, descriptions of components that are substantially identical or similar to the components of the pixel PX1 described with reference to FIG. 2 will be omitted.

In an embodiment, the second transistor T2 may be connected between a data line DL configured to transmit the data voltage VDAT and the second node N2, and turned on in response to the write gate signal GW having a low voltage level. The second transistor T2 may include a first electrode connected to the data line DL, a second electrode connected to the second node N2, and a gate electrode configured to receive the write gate signal GW. The second transistor T2 may transmit the data voltage VDAT to the second node N2 in response to the write gate signal GW having the low voltage level.

In an embodiment, the third transistor T3 may be connected between the first node N1 and the third node N3, and turned on in response to the compensation gate signal GC having a high voltage level. The third transistor T3 may include a first electrode connected to the first node N1, a second electrode connected to the third node N3, and a gate electrode configured to receive the compensation gate signal GC. The third transistor T3 may connect the first node N1 to the third node N3 in response to the compensation gate signal GC having the high voltage level.

In an embodiment, the parasitic capacitor CPR may be formed between the data line DL and the second node N2. The parasitic capacitor CPR may be an unintended capacitor generated by overlapping of the data line DL and the second node N2. When the data voltage VDAT transmitted by the data line DL is changed by a coupling effect of the parasitic capacitor CPR, a voltage of the second node N2 may be changed.

In an embodiment, an operation of the pixel PX2 of FIG. 13 may be substantially identical or similar to the operation of the pixel PX1 of FIG. 2 described with reference to FIG. 3.

Figure 14:
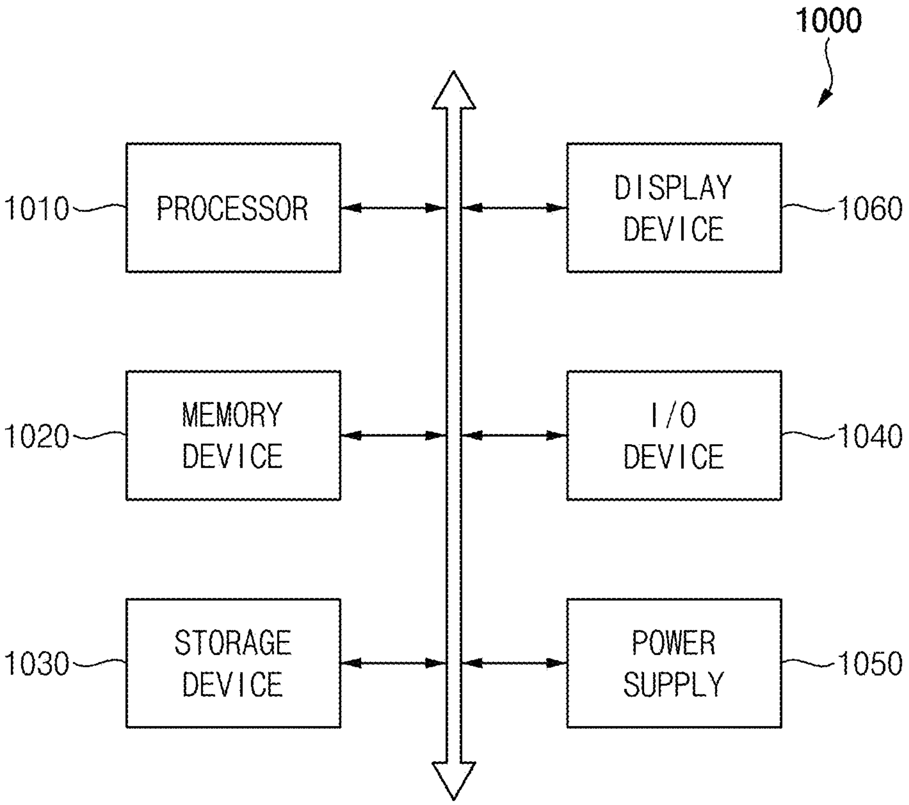
FIG. 14 is a block diagram showing an electronic device, according to an embodiment.
Figure 15:
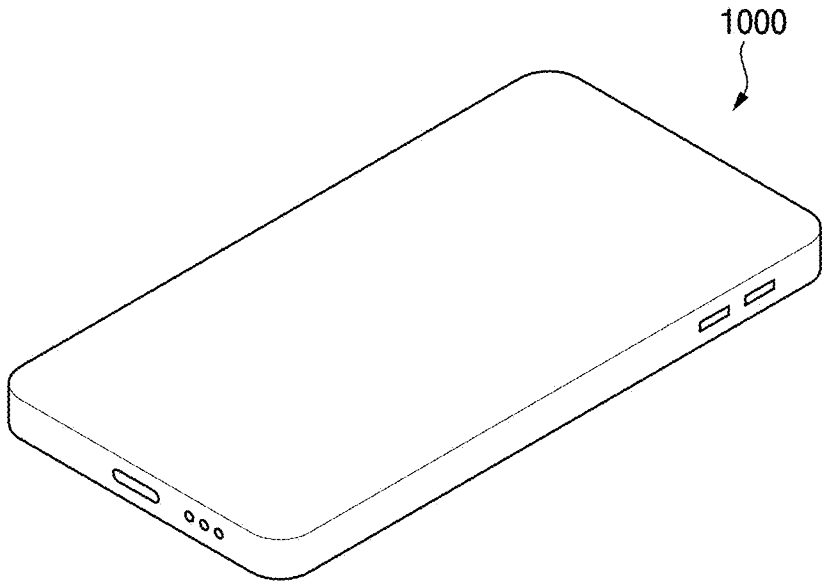
FIG. 15 is a perspective view showing an example in which the electronic device of FIG. 14 is implemented as a smart phone, according to an embodiment.

FIG. 14 is a block diagram showing an electronic device 1000, according to an embodiment. FIG. 15 is a perspective view showing an example in which the electronic device 1000 of FIG. 14 is implemented as a smart phone, according to an embodiment.

In an embodiment and referring to FIGS. 14 and 15, an electronic device 1000 may include a processor 1010, a memory device 1020, a storage device 1030, an input/output (I/O) device 1040, a power supply 1050, and a display device 1060. The display device 1060 may correspond to the display device 100 of FIG. 1. The electronic device 1000 may further include a plurality of ports capable of communicating with a video card, a sound card, a memory card, a USB device, or the like, or communicating with other systems.

According to an embodiment, as shown in FIG. 15, the electronic device 1000 may be implemented as a smart phone. However, the invention is not limited thereto, and according to another embodiment, the electronic device 1000 may be implemented as a television, a mobile phone, a video phone, a smart watch, a smart pad, a tablet PC, a vehicle navigation, a laptop computer, a head-mounted display, or the like.

In an embodiment, the processor 1010 may perform specific calculations or tasks. According to an embodiment, the processor 1010 may be a microprocessor, a central processing unit (CPU), or the like. The processor 1010 may be connected to other components through an address bus, a control bus, a data bus, and the like. According to an embodiment, the processor 1010 may also be coupled to an expansion bus such as a peripheral component interconnect (PCI) bus. According to an embodiment, the processor 1010 may provide first image data (IMD1 of FIG. 1) and a control signal (CNT of FIG. 1) to the display device 1060.

In an embodiment, the memory device 1020 may store data required for an operation of the electronic device 1000. For example, the memory device 1020 may include a nonvolatile memory device such as an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM). The memory device 1020 may also include a volatile memory device such as a dynamic random access memory (DRAM), a static random access memory (SRAM), or a mobile DRAM.

In an embodiment, the storage device 1030 may include a solid state drive (SSD), a hard disk drive (HDD), a CD-ROM, and the like. The I/O device 1040 may include an input device such as a keyboard, a keypad, a touch pad, a touch screen, a mouse and an output device such as a speaker or a printer. The power supply 1050 may supply a power required for the operation of the electronic device 1000. The display device 1060 may be connected to other components through the buses or other communication links.

In an embodiment, according to a pixel included in the display device 1060, a first power voltage may be applied to a first electrode of a first transistor through a fifth transistor based on a compensation gate signal during a frame period except for a compensation period in which a threshold voltage of the first transistor is compensated for, so that a voltage of the first electrode of the first transistor may be stabilized. Accordingly, a blotch defect may not occur in the display device 1060, and image quality of the display device 1060 may be improved.

According to embodiments, the invention may be applied to a display device included in a computer, a notebook, a mobile phone, a smart phone, a smart pad, a PMP, a PDA, an MP3 player, or the like.

Although the display devices, according to embodiments, have been described with reference to the drawings, the illustrated embodiments are only examples, and may be modified and changed by a person having ordinary knowledge in the relevant technical field without departing from the spirit of the invention. Accordingly, the invention should not be construed as being limited to the embodiments set forth herein. Rather, these embodiments are provided so that this disclosure will be thorough and complete and will fully convey the invention to those skilled in the art. And, while the invention has been particularly shown and described with reference to embodiments thereof, it will be understood by those of ordinary skill in the art that various changes in form and details may be made therein without departing from the spirit or scope of the invention. Moreover, the embodiments or parts of the embodiments may be combined in whole or in part without departing from the scope of the invention.

What is claimed is:

1. A display device comprising:

a plurality of pixels, wherein each of the plurality of pixels includes:

a first transistor connected between a first node and a second node, and including a gate electrode connected to a third node;

a second transistor connected between a data line and the first node, and including a gate electrode configured to receive a write gate signal, wherein the data line is configured to transmit a data voltage;

a third transistor connected between the second node and the third node, and including a gate electrode configured to receive a compensation gate signal, wherein the compensation gate signal is configured to turn on the third transistor during a compensation period to enable threshold voltage compensation of the first transistor;

a fourth transistor connected between a first initialization voltage line and the third node, and including a gate electrode configured to receive an initialization gate signal, wherein the first initialization voltage line is configured to transmit a first initialization voltage;

a fifth transistor connected between a first power line and the first node, and including a gate electrode configured to receive the compensation gate signal, wherein the compensation gate signal is further configured to turn on the fifth transistor outside the compensation period to apply a first power voltage to the first node, wherein the first power line is configured to transmit the first power voltage;

a sixth transistor connected between the second node and a fourth node, and including a gate electrode configured to receive an emission control signal, wherein the emission control signal is configured to turn on the sixth transistor during an emission period to enable current flow through a light emitting element and to turn off the sixth transistor outside the emission period to disable current flow through the light emitting element;

a storage capacitor connected between the third node and the first power line; and the light emitting element connected between the fourth node and a second power line configured to transmit a second power voltage, wherein a frame period in which each of the pixels is driven includes an initialization period in which the fourth transistor is turned on in response to the initialization gate signal, the compensation period in which the third transistor is turned on in response to the compensation gate signal, and the emission period in which the sixth transistor is turned on in response to the emission control signal, and wherein the first power voltage is applied to the first node during a period, with the exception of the compensation period.

2. The display device of claim 1, wherein the frame period further includes a write period in which the second transistor is turned on in response to the write gate signal, wherein the write period is located within the compensation period.

3. The display device of claim 1, wherein the third transistor includes an N-type transistor, and the fifth transistor includes a P-type transistor.

4. The display device of claim 1, wherein each of the plurality of pixels further includes a parasitic capacitor formed between the data line and the first node.

5. The display device of claim 1, wherein each of the plurality of pixels further includes a seventh transistor connected between a second initialization voltage line that is configured to transmit a second initialization voltage and the fourth node, wherein the seventh transistor is configured to receive a bypass gate signal.

6. A display device comprising:

a plurality of pixel circuits, wherein each of the pixel circuits includes:

a first active layer disposed on a substrate, and including a first channel region, a second channel region, a fifth channel region, and a sixth channel region;

a first conductive layer disposed on the first active layer, and including a first gate pattern overlapping the first channel region, a write gate line overlapping the second channel region, a second gate pattern overlapping the fifth channel region, and an emission control line overlapping the sixth channel region;

a second conductive layer disposed on the first conductive layer, and including a capacitor pattern overlapping the first gate pattern, a first compensation gate line configured to transmit a compensation gate signal, and a first initialization gate line configured to transmit an initialization gate signal;

a second active layer disposed on the second conductive layer, and including a third channel region overlapping the first compensation gate line and a fourth channel region overlapping the first initialization gate line;

a third conductive layer disposed on the second active layer, and including a second compensation gate line overlapping the third channel region and a second initialization gate line overlapping the fourth channel region; and a fourth conductive layer disposed on the third conductive layer, and including a gate connection pattern making contact with the first gate pattern and a third drain region disposed on the second active layer and located between the third channel region and the fourth channel region and a compensation connection pattern making contact with the second gate pattern and the first compensation gate line.

7. The display device of claim 6, wherein the gate connection pattern does not overlap the second compensation gate line.

8. The display device of claim 6, wherein the capacitor pattern is disposed between the first compensation gate line and the first initialization gate line when viewed in a plan view.

9. The display device of claim 6, wherein the fourth conductive layer further includes:

a data connection pattern making contact with a second source region disposed on the first active layer and located on one side of the second channel region;

a power connection pattern making contact with a fifth source region disposed on the first active layer and located on one side of the fifth channel region and the capacitor pattern;

an active connection pattern making contact with a first drain region disposed on the first active layer and located on one side of the first channel region and a third source region disposed on the second active layer and located on one side of the third channel region; and a first connection pattern making contact with a sixth drain region disposed on the first active layer and located on one side of the sixth channel region.

10. The display device of claim 9, wherein each of the plurality of pixel circuits further includes a fifth conductive layer disposed on the fourth conductive layer, and including a data line making contact with the data connection pattern, a first power line making contact with the power connection pattern, and a second connection pattern making contact with the first connection pattern.

11. The display device of claim 6, wherein the second conductive layer further includes a first initialization voltage line configured to transmit a first initialization voltage, and wherein the fourth conductive layer further includes an initialization connection pattern making contact with the first initialization voltage line and a fourth source region disposed on the second active layer and located on one side of the fourth channel region.

12. The display device of claim 6, wherein the first active layer further includes a seventh channel region overlapping the write gate line, and wherein the fourth conductive layer further includes a second initialization voltage line configured to transmit a second initialization voltage and making contact with a seventh source region disposed on the first active layer and located on one side of the seventh channel region.

13. The display device of claim 6, wherein the first active layer includes polycrystalline silicon, and the second active layer includes an oxide semiconductor.

14. A display device comprising:

a plurality of pixels, wherein each of the plurality of pixels includes:

a first transistor connected between a first node and a second node, and including a gate electrode connected to a third node;

a second transistor connected between a data line and the second node, and including a gate electrode configured to receive a write gate signal, wherein the data line is configured to transmit a data voltage;

a third transistor connected between the first node and the third node, and including a gate electrode configured to receive a compensation gate signal, wherein the compensation gate signal is configured to turn on the third transistor during a compensation period to enable threshold voltage compensation of the first transistor;

a fourth transistor connected between a first initialization voltage line and the third node, and including a gate electrode configured to receive an initialization gate signal, wherein the first initialization voltage line is configured to transmit a first initialization voltage;

a fifth transistor connected between a first power line and the first node, and including a gate electrode configured to receive the compensation gate signal, wherein the compensation gate signal is further configured to turn on the fifth transistor outside the compensation period to apply a first power voltage to the first node, wherein the first power line is configured to transmit the first power voltage;

a sixth transistor connected between the second node and a fourth node, and including a gate electrode configured to receive an emission control signal, wherein the emission control signal is configured to turn on the sixth transistor during an emission period to enable current flow through a light emitting element and to turn off the sixth transistor outside the emission period to disable current flow through the light emitting element;

a storage capacitor connected between the third node and the first power line; and the light emitting element connected between the fourth node and a second power line configured to transmit a second power voltage, wherein a frame period in which each of the plurality of pixels is driven includes an initialization period in which the fourth transistor is turned on in response to the initialization gate signal, the compensation period in which the third transistor is turned on in response to the compensation gate signal, and the emission period in which the sixth transistor is turned on in response to the emission control signal, and wherein the first power voltage is applied to the first node during a period, with the exception of the compensation period.

15. The display device of claim 14, wherein the frame period further includes a write period in which the second transistor is turned on in response to the write gate signal, and wherein the write period is located within the compensation period.

16. The display device of claim 14, wherein the third transistor includes an N-type transistor, and the fifth transistor includes a P-type transistor.

17. The display device of claim 14, wherein each of the plurality of pixels further includes a parasitic capacitor formed between the data line and the second node.

18. The display device of claim 14, wherein each of the plurality of pixels further includes a seventh transistor connected between a second initialization voltage line and the fourth node, and configured to receive a bypass gate signal, wherein the second initialization voltage line is configured to transmit a second initialization voltage.

* * * * *